United States Patent
Sirito-Olivier et al.

(10) Patent No.: US 6,728,521 B1
(45) Date of Patent: Apr. 27, 2004

(54) PHASE LOCKED DEVICE WITH REDUCED ELECTRICAL CONSUMPTION

(75) Inventors: Philippe Sirito-Olivier, Saint Egreve (FR); Christophe Dugas, Voreppe (FR)

(73) Assignee: STMicroelectronics, S.A., Crolles (FR)

( * ) Notice: Subject to any disclaimer, the term of this patent is extended or adjusted under 35 U.S.C. 154(b) by 0 days.

(21) Appl. No.: 09/577,064

(22) Filed: May 22, 2000

(30) Foreign Application Priority Data

May 28, 1999 (FR) .............................................. 99 07019

(51) Int. Cl.[7] .................................................. H04Q 7/20

(52) U.S. Cl. ................................. 455/165.1; 455/180.3; 455/183.1

(58) Field of Search ........................... 455/23, 85, 86, 455/574, 127, 147, 165.1, 180.3, 196.1, 208, 255, 258, 259, 260, 265; 327/143, 156, 147, 105; 331/18, 23, 25, 48, 177 R; 375/327, 322, 376, 222, 371, 373

(56) References Cited

U.S. PATENT DOCUMENTS

| | | | | |
|---|---|---|---|---|
| 4,667,169 A | * | 5/1987 | Matsuura et al. | 331/14 |
| 4,893,094 A | * | 1/1990 | Herold et al. | 323/314 |
| 5,202,906 A | * | 4/1993 | Saito et al. | 331/14 |
| 5,402,446 A | * | 3/1995 | Minami | 375/344 |
| 5,475,877 A | * | 12/1995 | Adachi | 455/343 |
| 5,568,098 A | * | 10/1996 | Horie et al. | 331/16 |
| 5,594,735 A | * | 1/1997 | Jokura | 370/337 |
| 6,366,622 B1 | * | 4/2002 | Brown et al. | 375/322 |

* cited by examiner

Primary Examiner—Jean Gelin

(57) ABSTRACT

The invention relates to a radio device comprising a primary oscillator, a phase locked loop driven by a signal provided by the primary oscillator and a radio emitter and/or receiver circuit receiving as an input a radio frequency signal provided by the phase locked loop. According to the invention, the device comprises means for powering-on the elements of the radio device in a progressive and sequential way, according to a determined starting order of these elements. Application in particular to sensors and meters with data teletransmission, to remote controlled actuators and radio-telephones.

8 Claims, 2 Drawing Sheets

PHASE LOCKED DEVICE WITH REDUCED ELECTRICAL CONSUMPTION

BACKGROUND OF THE INVENTION

1. Technical Field

The present invention relates to a radio device comprising a primary oscillator, a phase locked loop driven by a signal provided by the primary oscillator, and a radio emitter and/or receiver circuit receiving a radio frequency signal provided by the phase locked loop.

2. Description of the Related Art

Generally, radio emitter and/or receiver circuits need for their operation (carrier detection, modulation and demodulation) a radio frequency signal produced by an oscillator. This oscillator is, for example, of the resonance type, frequency multiplication type, or still frequency synthesis type by means of a phase locked loop.

Oscillators provided with a phase locked loop are commonly used in applications requiring several frequency channels, because the passage from a radio channel to another is then obtained by a simple change of the division range of a programmable frequency divider arranged in the phase locked loop.

Furthermore, with the evolution of silicon integration techniques for radio emitter-receiver circuits and the decrease of their cost price, there have been developed various applications of these circuits directed to the teletransmission of data provided by measurement systems like sensors or meters, or still to the remote control of actuating systems.

As an example, FIG. 1 schematically represents a meter 1, for example a gas meter, provided with a radio device 2 for transmitting meter data in a hertzian way. The radio device 2 comprises an emitter-receiver circuit 3 receiving as an input a radio frequency signal $S_{RF}$ provided by a phase locked loop 4, the phase locked loop being driven by a signal $S_{ref}$ provided by a primary oscillator 5.

In this kind of application, the radio device 2 is generally autonomous and comprises its own electric supply source, such as a battery or a small battery set. To spare the lifetime of the supply source, the radio device 2 operates by intermittence according to a determined data transfer protocol in order to reduce the periods of radio activity. For example, the protocol consists in setting the device 2 in reception mode during a fraction of a second every 10 seconds, continuously or at some hours of the day or the month. When a data transmission request is received (tele-reading of the meter), the device switches from the reception mode to the emission mode, sends the data provided by the meter, and then comes back to the stand-by state. If, on the other hand, no call is detected (absence of carrier), the device comes back immediately to the stand-by state.

In practice, data transmission requests are infrequent and the average electric consumption of radio device 2 is essentially determined by the numerous radio listening periods. FIG. 2A represents the graph of the current which is consumed by device 2 and shows that each radio listening period $P_{Rx}$ comprises a period $T_{start}$ for powering-on the device 2, during which device 2 switches from the stand-by state to the active state, and a period $T_{Rx}$, during which the device is effectively operational in the reception mode. The starting time $T_{start}$ is relatively long, in the order of some milliseconds to some tens of milliseconds. This time $T_{start}$ is in particular determined by the starting time of the primary oscillator 5, to which is added the starting and stabilisation time of the phase locked loop 4 and, once the loop 4 is locked, the time for powering-on the emission-reception circuit 3. On the other hand, the listening time $T_{Rx}$ itself is generally very short, as the device comes back immediately to the stand-by state when the carrier RF is not detected or when the received message does not need a response.

Thus, it appears that the starting time $T_{start}$ has a non-negligible influence on the average consumption of a radio device operating in an intermittent way during short duration periods.

As illustrated in FIG. 2B, this drawback is also found in applications in which radio device 2 operates in the emission mode only and repetitively sends data supplied by meter 1, for example every 10 seconds, without knowing if these data are received by an operator. Here, the practice is to repeat the emission sequences that ensure that the data will be accessible at the moment of tele-reading. In this application as in the preceding application, each emission period $P_{Tx}$ comprises an operational period $T_{Tx}$ preceded by a powering-on period $T_{start}$ having a non-negligible influence on the electric consumption.

A conventional solution to reduce this drawback consists in improving the integrated circuits' technological characteristics which have an incidence on their electric consumption and their switching speed. However, the stabilization time of a phase locked loop depends on various other parameters, in particular the characteristics of a loop filter ensuring the spectral purity of the signal $S_{RF}$ and is all the longer as the bandwidth of this filter is narrow. Also, a quartz oscillator presents a non-negligible starting time determined by the piezoelectric properties of quartz.

To reduce this drawback, the present invention is based on the observation that, when starting the radio device, the powering-on of some elements—and the resulting current consumption—is not useful, because these elements cannot become operational as long as other elements are not themselves operational. For example, in FIG. 1, the phase locked loop 4 cannot be locked as long as the primary oscillator 5 providing the reference signal $S_{ref}$ is not operational.

SUMMARY OF THE INVENTION

Thus, the present invention provides a radio device of the type described above comprising means for progressively powering-on the elements of the radio device according to a predetermined starting order of these elements.

According to one embodiment, the powering-on means are arranged to power-on the primary oscillator before powering-on the phase locked loop.

Preferably, when the phase locked loop comprises a phase comparator, a voltage controlled oscillator and loop elements, the powering-on means are arranged to power-on the voltage controlled oscillator before powering-on other elements of the phase locked loop.

According to one embodiment, the powering-on means comprise temporization means for determining the duration between the powering-on of the voltage controlled oscillator and the powering-on of other elements of the phase locked loop.

According to one embodiment, the powering-on means comprise means for monitoring the output of the primary oscillator and are arranged to power-on at least one element of the phase locked loop when the output of the primary oscillator delivers a signal above a predetermined threshold. According to one embodiment, the powering-on means are arranged for powering-on the radio emitter and/or receiver circuit only after the powering-on of all the elements of the phase locked loop. The powering-on means comprise for example means for detecting the locking of the phase locked loop, and are arranged to power-on the radio emitter and/or receiver circuit when the phase locked loop is locked.

The means for detecting the locking of the phase locked loop comprise for example a window comparator receiving as an input the control signal of the voltage controlled oscillator.

According to one embodiment, the phase locked loop comprises a programmable frequency divider enabling the change of the frequency of the radio frequency signal that it delivers, and the powering-on means are arranged to disable the radio emitter and/or receiver circuit when the division range of the frequency divider is changed, and power-on again the emitter and/or receiver circuit when the phase locked loop is locked upon a new frequency.

The present invention is also directed to a device, in particular a sensor or meter of a physical magnitude, an actuator, a radio-telephone, comprising a radio device as described above.

BRIEF DESCRIPTION OF THE DRAWINGS

These objects, characteristics and advantages of the present invention will be described in greater detail in the following description of one embodiment of an electronic device according to the invention, given by way of example and in a non-limiting way, in conjunction with the accompanying drawings in which.

DETAILED DESCRIPTION OF THE PREFERRED EMBODIMENT

Figure 1:
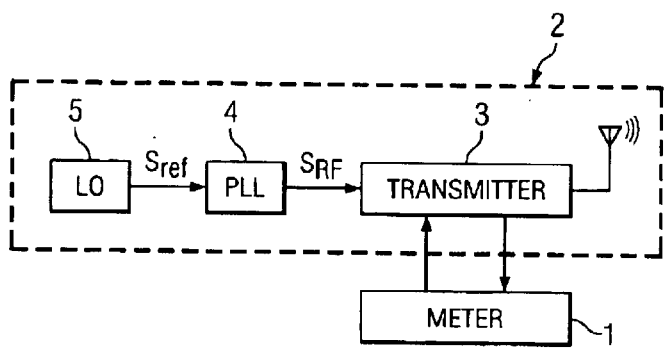
FIG. 1, previously described, represents schematically a meter provided with a radio device.

Radio device 20 comprises an emitter-receiver circuit 21 comprising an emitter block Tx and a receiver block Rx, a phase locked loop 22 and a primary oscillator 23. In a conventional way, the locked loop 22 comprises a phase comparator 24, a loop filter 25 of the low-pass type, a voltage controlled oscillator 26 (VCO) and an N range programmable frequency divider 27 controlled by microprocessor 12. The phase comparator 24 receives on a first input a reference signal $S_{ref}$ delivered by the primary oscillator 23, and, on another input, the output of divider 27. The output of comparator 24 is applied to oscillator 26 by means of filter 25. The output of oscillator 26, applied to the input of divider 27, delivers a radio frequency signal $S_{RF}$ which has a frequency N times higher than the frequency of the signal $S_{ref}$, and is sent to the emitter-receiver circuit 21.

Yet in a conventional way, block Rx comprises receiving amplifiers, mixers and demodulators (not shown), and block Tx comprises modulators and amplification chains. The data $DT_{Rx}$ (controls) received by block Rx are supplied to microprocessor 12 for analysis and processing, and the meter data $DT_{Tx}$ provided by metering unit 11 are read by microprocessor 12 and applied to block Tx for their transmission in a hertzian way.

Figure 2A:
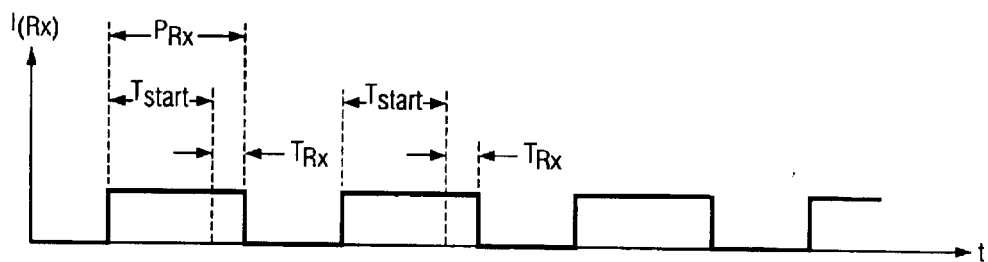
FIGS. 2A, 2B are graphs representing the current consumed by a radio device which operates intermittently in reception or in emission mode.
Figure 2B:
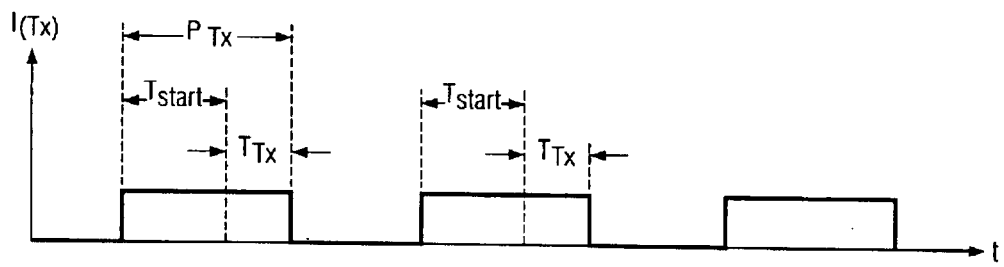

Meter 10 operates by intermittence in a way already described in relation with FIGS. 2A, 2B, that is according to listening phases $P_{Rx}$ allowing the detection of a request for sending $DT_{Tx}$ data or, alternatively depending on the application, according to systematic sending phases $P_{Tx}$ of $DT_{Tx}$ data. What ever the chosen operating mode may be, each phase comprises a starting period $T_{start}$ followed by an operational period $T_{Rx}$ or $T_{tx}$.

In the prior art, the starting of radio device 20 is performed by simultaneously powering-on all its constitutive elements, that is the primary oscillator 23, the loop 22 and the elements of block Tx or block Rx. According to the invention, it is on the contrary considered that the simultaneous power supply of all these elements leads to a useless loss of electric energy having a significant incidence on the average consumption.

Thus, according to the invention, the supply voltage Vcc is sequentially and progressively applied to the various elements of radio circuit 20 by means of switches SW1 to SW6 driven by a sequence circuit 28. More particularly, the voltage Vcc is applied to primary oscillator 23 by means of switch SW1, to comparator 24 by means of switch SW2, to oscillator 26 by means of switch SW3, to divider 27 by means of switch SW4, and respectively to the blocks Rx, Tx by means of the switches SW5, SW6.

Table 1 hereafter describes the operation of the sequence circuit 28. The progressive powering-on of radio device 20, from a step E0 corresponding to the stand-by state, is here performed with three intermediate steps E1 to E3 followed by a final step E4 during which block Rx or block Tx is powered-up.

TABLE 1

| Steps | Duration | Consumed current | Powered-up elements |
|---|---|---|---|
| E0 | — | — | None (stand-by) |
| E1 | T1 | I1 | Primary oscillator 23 |
| E2 | T2 | I2 | Primary oscillator 23 + VCO oscillator 26 |
| E3 | T3 | I3 | Primary oscillator 23 + VCO oscillator 26 + phase comparator 24 + divider 27 + other possible elements of loop 22 |
| E4 | T4 | I4 | Primary oscillator 23 + VCO oscillator 26 + phase comparator 24 + divider 27 + other possible elements of loop 22 + block Rx or block Tx |

Figure 3:
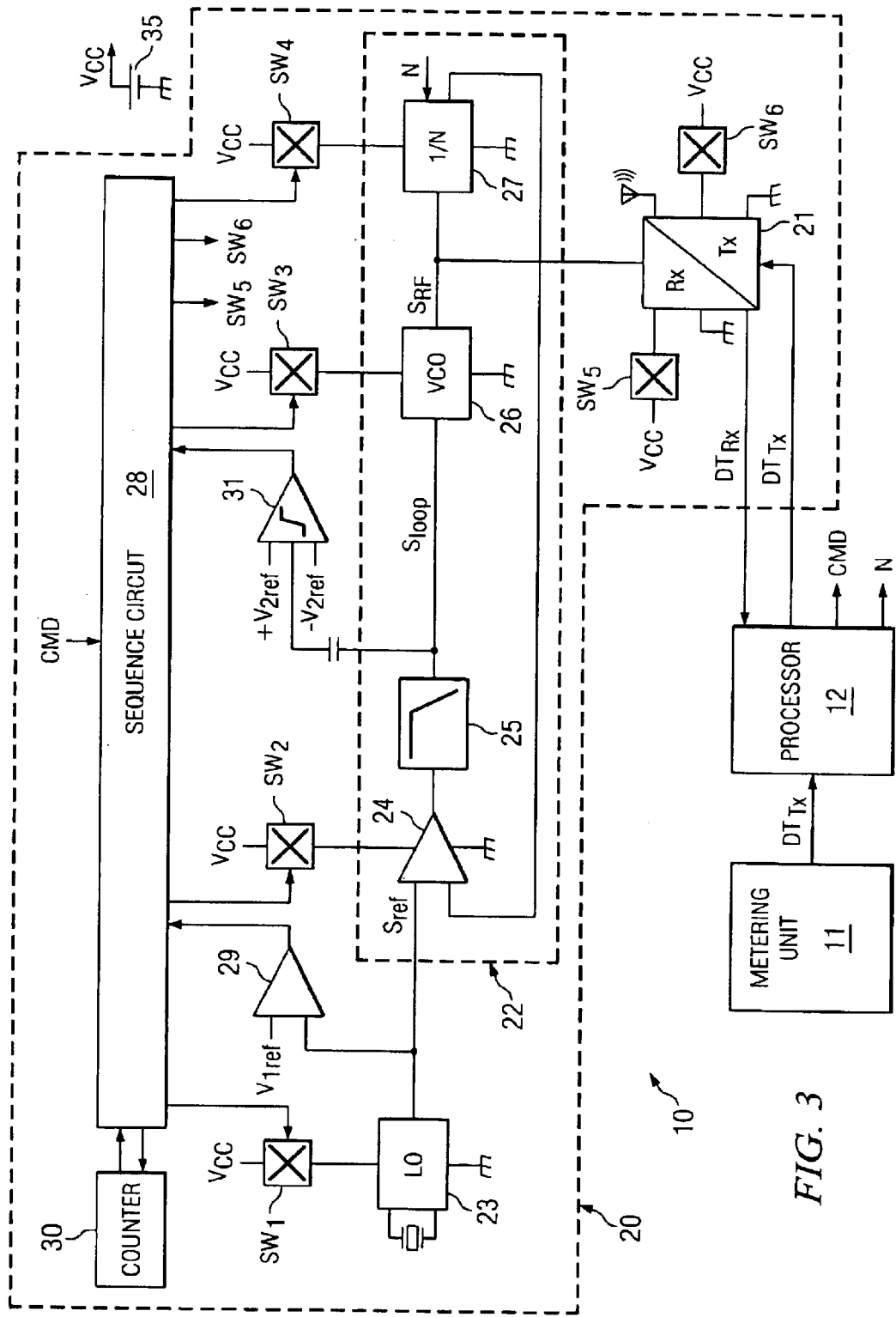
FIG. 3 represents, in block form, the electrical diagram of a meter comprising a radio device according to the invention.

The duration T1 of step E1 is preferably selected to match the time necessary for the stabilization of primary oscillator 23. As illustrated in FIG. 3, a comparator 29 is provided to this effect, which receives the output of oscillator 23 and a reference voltage $V_{1ref}$ as an input, and whose output is applied to the sequence circuit 28. Thus, when the signal $S_{ref}$ presents a voltage above $V_{ref}$, the value of the output of comparator 29 changes and the sequence circuit 28 passes from step E1 to step E2.

The duration T2 of step E2 is preferably determined by a counter 30 of the "timer" type, connected to the sequence circuit 28, and is selected according to experimental observations in order to match the stabilization time of the VCO oscillator 26. 190, Lastly, the duration T3 of step E3 is preferably determined by a means for detecting the locking of loop 22. This means is, for example, a window comparator 31 presenting a non zero relaxation time τ, and whose output is applied to the sequence circuit 28. Comparator 31 receives as an input two reference voltages +$V_{2ref}$, −$V_{2ref}$, as well as the signal $S_{loop}$ for controlling the oscillator 26, taken at the output of loop filter 25 by means of a capacitor. When the loop 22 is not locked, the signal $S_{loop}$ oscillates beyond the thresholds +$V_{2ref}$, −$V_{2ref}$, and the output of comparator 31 is in a high state. When the signal $S_{loop}$ stabilises within the window +$V_{2ref}$, −$V_{2ref}$, the output of comparator 31 switches again to a low state after the relaxation time τ has elapsed.

To aid in better understanding about the advantages of the invention, Table 2 hereafter describes experimental results obtained by the Applicant using a silicon integrated radio device 20, for the passage from the stand-by state to the reception mode Rx (block Tx non activated). In the prior art, with the same integrated circuit, the passage from the stand-by state to the Rx mode requires the same duration of 13.64 ms and is performed with the maximal current I4 of 11.00 mA, which corresponds to an electricity quantity of 150.040 μC. Thus, here, the present invention enables a decrease of 55% of the electric consumption during the starting phase.

TABLE 2 passage to the Rx mode

|    | I (mA)              | Duration (ms) | Qi (μC) |
|----|---------------------|---------------|---------|
| E0 | 0                   | —             | 0       |
| E1 | I1 = 0.57           | T1 = 3.50     | 1.995   |
| E2 | I2 = 1.10           | T2 = 0.64     | 0.704   |
| E3 | I3 = 6.80           | T3 = 9.50     | 64.600  |
|    | TOTAL Wake-up phase | 13.64         | 67.299  |
| E4 | I4 (Rx) = 11.00     |               |         |

Furthermore, Table 3 hereafter describes experimental results obtained during the passage from the stand-by state to the emission mode Tx (Rx circuit non activated). In the prior art, the passage from the stand-by state to the Tx mode in 20.14 ms with a maximal current I4 of 18.00 mA corresponds to an electricity quantity of 362.520 μC. Thus, here, the present invention enables a decrease of 69% of the electric consumption during the starting phase.

TABLE 3 passage to the Tx mode

|    | I (mA)              | Duration (ms) | Qi (μC) |
|----|---------------------|---------------|---------|
| E0 | 0                   | —             | 0       |
| E1 | I1 = 0.57           | T1 = 3.50     | 1.995   |
| E2 | I2 = 1.10           | T2 = 0.64     | 0.704   |
| E3 | I3 = 6.80           | T3 = 16.00    | 108.800 |
|    | TOTAL Wake-up phase | 20.14         | 111.499 |
| E4 | I4 (Tx) = 18.00     |               |         |

Figure 4:
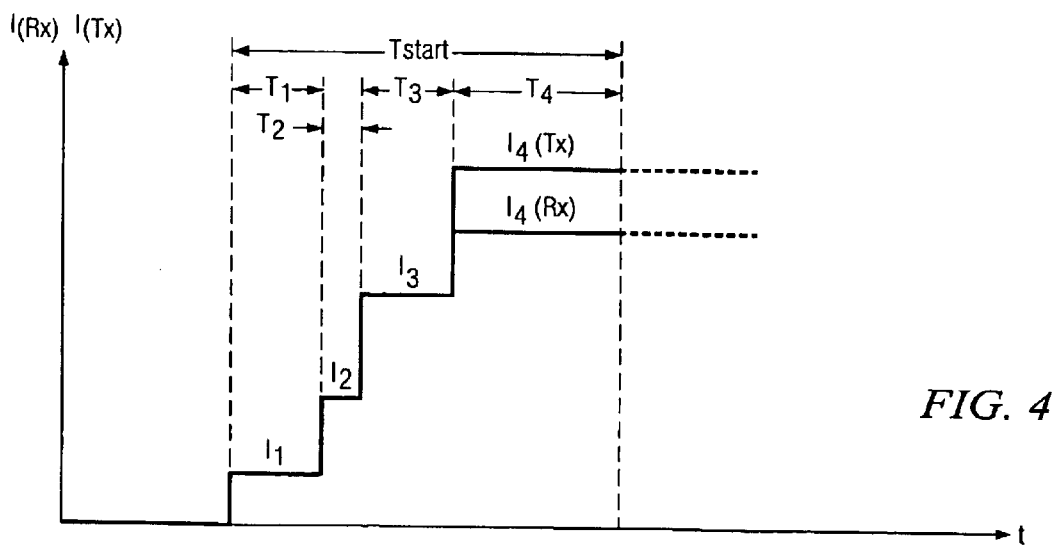
FIG. 4 is a graph representing the current consumed by the radio device according to the invention.

To summarize the foregoing, FIG. 4 represents the graph of the starting current I(Rx) or I(Tx) in the Rx or Tx mode in accordance with the values given by Table 2 and Table 3. It can be seen that this graph presents a stair-step form, which indicates a lower consumption than the graphs in square form of FIG. 2A and FIG. 2B.

According to another aspect of the invention, the electric consumption of the device 20 is also optimised during a radio channel change, which may occur in reception mode Rx, emission mode Tx or during a passage from the reception mode Rx to the emission mode Tx. As a matter of fact, after a change of the range N of divider 27 by microprocessor 12, the loop 22 needs some time to lock upon the new frequency. During said time, the operational block Rx or Tx consumes current unnecessarily. Thus, the present invention provides that the Rx or Tx block in question is no more electrically supplied by the sequence circuit 28 during this period, until the output of the detector of locked state 31 switches again to a low state. In practice, to manage these various sequences and possibilities of powering-on or powering-off elements of device 20, the sequence circuit 28 may receive, from microprocessor 12, CMD commands, for example coded with 3 bits, indicating the type of operation to be performed, in particular the passage from the stand-by state to the Rx mode, the passage of the stand-by state to the Tx mode, the temporary extinction of block Rx (channel change in RX mode), the temporary extinction of block Tx (channel change in TX mode), or the extinction of block Rx and the powering-on of block Tx after locking (channel change with passage from the Rx mode to the Tx mode).

It will be apparent that the present invention may, in practice, present various alternatives and embodiments. In particular, the man skilled in the art will provide, according to the features and the complexity of the radio device which is used, a more or less large number of powering-on steps. Furthermore, it will be apparent that the present invention is also directed to radio devices comprising several imbricated phase locked loops. In this case, it is within the skills of the man skilled in the art to determine, after an observation of the starting cycles of the various elements of the imbricated loops, the functional dependencies appearing between these elements and to deduce therefrom a starting sequence of these elements which is optimal in terms of electric consumption.

Lastly, it will be readily apparent that the present invention is suitable for any known device, in particular sensors and actuators comprising an on-board radio communication device, when a decrease of the average electric consumption of the radio device is desirable. The present invention is also suitable for radio-telephones presenting a reception mode of intermittent type (comprising for example 40 ms in reception mode and 80 ms in stand-by mode) in order to extend the lifetime of their batteries.

What is claimed is:

1. Radio device comprising a primary oscillator, at least one chase locked loop driven by a signal provided by the primary oscillator and a radio emitter and/or receiver circuit receiving as an input a radio frequency signal provided be the phase locked loop, the phase locked loop comprising a phase comparator, a voltage controlled oscillator and loop elements, characterized in that the radio device comprises means for powering-on the primary oscillator before powering-on the phase locked loop arranged to power-on the voltage controller oscillator before powering-on other elements of the phase locked loop.

2. Device according to claim 1, wherein the powering-on means comprise temporization means for determining the duration between the powering-on of the voltage controlled oscillator and the powering-on of other elements of the phase locked loop.

3. Device according to claim 2, wherein the powering-on means comprise means for monitoring the output of the primary oscillator and are arranged to power-on at least one element of the phase locked loop when the output of the primary oscillator delivers a signal above a predetermined threshold.

4. Device according to claim 1, wherein the powering-on means are arranged for powering-on the radio emitter and/or receiver circuit only after powering-on all the elements of the phase locked loop.

5. Device, in particular a sensor or a meter of a physical magnitude, an actuator, a radiotelephone, comprising a radio device according to claim 1.

6. Radio device comprising a primary oscillator, at least one phase locked loop driven by a signal provided by primary oscillator and a radio emitter and/or receiver circuit receiving as an input a radio frequency signal provided by the phase locked loop, the phase locked loop comprising a phase comparator, a voltage controlled oscillator and loop elements, characterized in that the radio device comprises means for powering-on the primary oscillator before powering-on the phase locked loop,
    wherein the powering-on means comprise means for detecting the locking of the phase locked loop and are arranged to power-on the radio emitter and/or receiver circuit when the phase locked loop is locked.

7. Device according to claim 6, wherein the means for detecting the locking of the phase locked loop comprise a window comparator receiving as an input the control signal of the voltage controlled oscillator.

8. Radio device comprising a primary oscillator, at least one phase locked loop driven by a signal provided by the primary oscillator and a radio emitter and/or receiver circuit receiving as an input a radio frequency signal provided by the phase locked loop, the phase locked loop comprising a phase comparator, a voltage controlled oscillator and loop elements, characterized in that the radio device comprises means for powering-on the primary oscillator before powering-on the phase locked loop,
    wherein the phase locked loop comprises a programmable frequency divider enabling the change of the frequency of the radio frequency signal that the programmable frequency divider delivers, and the powering-on means are arranged to disable the radio emitter and/or receiver circuit when the division range of the frequency divider is changed, and power-on again the emitter and/or receiver circuit when the phase locked loop is locked upon a new frequency.

\* \* \* \* \*